(12) United States Patent
Akram et al.

(10) Patent No.: US 6,365,967 B1
(45) Date of Patent: Apr. 2, 2002

(54) INTERCONNECT STRUCTURE

(75) Inventors: Salman Akram; David Hembree, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/318,280

(22) Filed: May 25, 1999

(51) Int. Cl.[7] ............................................. H01L 23/48
(52) U.S. Cl. ................................... 257/734; 29/592
(58) Field of Search .............................. 257/734, 737; 438/17, 618; 29/593, 705, 592, 739, 592.1

(56) References Cited

U.S. PATENT DOCUMENTS

| | | | | |
|---|---|---|---|---|
| 4,813,129 A | * | 3/1989 | Karnezos | 29/832 |
| 5,370,923 A | * | 12/1994 | Goad et al. | 428/209 |
| 5,483,741 A | * | 1/1996 | Akram et al. | 29/846 |
| 5,835,112 A | * | 11/1998 | Whitlock et al. | 347/50 |
| 6,060,778 A | * | 5/2000 | Jeong et al. | 257/710 |
| 6,075,710 A | * | 6/2000 | Lau | 257/737 |
| 6,093,643 A | * | 7/2000 | Akram | 438/652 |

* cited by examiner

*Primary Examiner*—Don Wong
*Assistant Examiner*—Thuy Vinh Tran
(74) *Attorney, Agent, or Firm*—Williams, Morgan & Amerson, P.C.

(57) ABSTRACT

A method for forming an interconnect structure includes providing a substrate, and forming a raised contact member on the substrate. A conductive layer is formed covering at least a portion of the raised contact member. A conductive trace is formed on the substrate in electrical communication with the conductive layer, and an alignment grid is formed on the substrate proximate the raised contact member. An interconnect structure includes a substrate and a raised contact member defined in the substrate. A conductive layer covers at least a portion of the raised contact member, and a conductive trace is in electrical communication with the conductive layer. An alignment grid is proximate the raised contact member.

17 Claims, 9 Drawing Sheets

INTERCONNECT STRUCTURE

BACKGROUND OF THE INVENTION

1. Field of the Invention

This invention relates generally to the manufacture of semiconductor devices and structures for testing unpackaged semiconductor devices having raised or bumped bond pads.

More particularly, the invention relates to an interconnect structure having a conductive pillar and alignment grid for contacting the bumps, balls, or bonding pads of a semiconductor device being tested.

2. Description of the Related Art

Many semiconductor devices are supplied by semiconductor manufacturers as flip chip devices or bumped chip scale packages for use in memory modules. In general, ball grid array (BGA) packages were developed to meet the demand for integrated circuit packages having higher lead counts and smaller footprints. A BGA package is typically a square package with terminals, normally in the form of an array of solder balls, protruding from the bottom of the package. These terminals are designed to be mounted onto a plurality of bonding sites located on the surface of a printed circuit board (PCB) or other suitable substrate. For some applications, solder bumps are deposited directly onto the surface of an IC itself and used for attachment to the PCB (commonly referred to as direct chip attach or flip chip).

Semiconductor die using BGA or an other raised topology are referred to as "bumped" die. Bumped semiconductor die include bond pads formed with a bump or ball of solderable material such as a lead-tin alloy. Bumped dice are often used for flip chip bonding wherein the die is mounted face down on a substrate, such as a printed circuit board, and then attached to the substrate by welding or soldering. Typically the bumps are formed as balls of material that are circular in a cross sectional plane parallel to the face of the die. The bumps typically have a diameter of from 0.15 mm to 2 mm.

A particular type of flip chip implementation is referred to as a chip scale package, because the total package size is similar or not much larger than the size of the die itself. In a chip scale package, the solder ball terminals are typically disposed underneath the semiconductor die to reduce the package size.

Various testing systems have been developed for testing BGA type packages, such as chip scale packages. These systems typically include a temporary carrier suitable for holding the package. In the temporary carrier, a non-permanent electrical connection is made between contact locations on the die (e.g., balls or bumps) and external test circuitry associated with the test apparatus. The balls provide a connection point for testing the integrated circuitry formed on the die.

In the past, following testing of a bumped die, it has been necessary to reflow the bumps, which are typically damaged by the test procedure. This is an additional process step that adds to the expense and complexity of the testing process. Furthermore, it requires heating the tested die, which can adversely affect the integrated circuitry formed on the die. U.S. Pat. No. 5,736,456, entitled "METHOD OF FORMING CONDUCTIVE BUMPS ON DIE FOR FLIP CHIP APPLICATIONS," describes a technique for forming raised bumps or balls on bond pads of a device under test. An exemplary prior interconnect structure is described in U.S. Pat. No. 5,592,736, entitled "FABRICATING AN INTERCONNECT FOR TESTING UNPACKAGED SEMICONDUCTOR DEVICE HAVING RAISED BOND PADS."

FIG. 1 illustrates a prior art interconnect structure 10 described in the '736 patent. The interconnect structure 10 includes a substrate 15 with an indentation 20 formed therein. Within the indentation 20, a series of blades 25 are provided for penetrating the surface of a raised bump (not shown) to establish electrical contact therewith. Other prior art interconnects have used the blade concept to pierce the bond pads of a device under test.

One limitation of the blade technique, is that, over time, material collects between adjacent blades 25 and reduces the reliability of the electrical connection with subsequent devices. In addition additional process steps are required to form the blades 25 and/or the indentation 20 in the bottom of which the blades are formed. Also, the geometry of the previously described interconnect structure 10 does not account for variation in the size of the ball. It is possible that a first ball may contact the interconnect structure 10, but a second, smaller ball may not be of sufficient size to reach the blades 25, thus hindering contact.

The present invention is directed to overcoming, or at least reducing the effects of, one or more of the problems set forth above.

SUMMARY OF THE INVENTION

An aspect of the present invention is seen in a method for forming an interconnect structure. The method includes providing a substrate, and forming a raised contact member on the substrate. A conductive layer is formed covering at least a portion of the raised contact member. A conductive trace is formed on the substrate in electrical communication with the conductive layer, and an alignment grid is formed on the substrate proximate the raised contact member.

Another aspect of the present invention is seen in an interconnect structure including a substrate and a raised contact member defined in the substrate. A conductive layer covers at least a portion of the raised contact member, and a conductive trace is in electrical communication with the conductive layer. An alignment grid is proximate the raised contact member.

BRIEF DESCRIPTION OF THE DRAWINGS

The invention may be best understood by reference to the following description taken in conjunction with the accompanying drawings, in which like reference numerals identify like elements, and in which.

Figure 1:
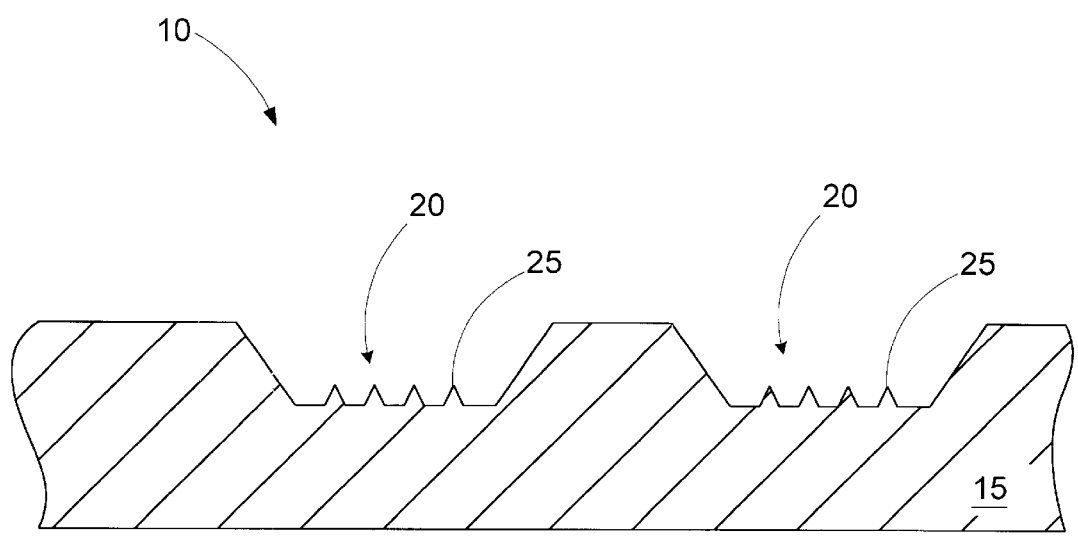
FIG. 1 is a cross-sectional view of an illustrative prior art semiconductor substrate having an interconnect structure formed thereon.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
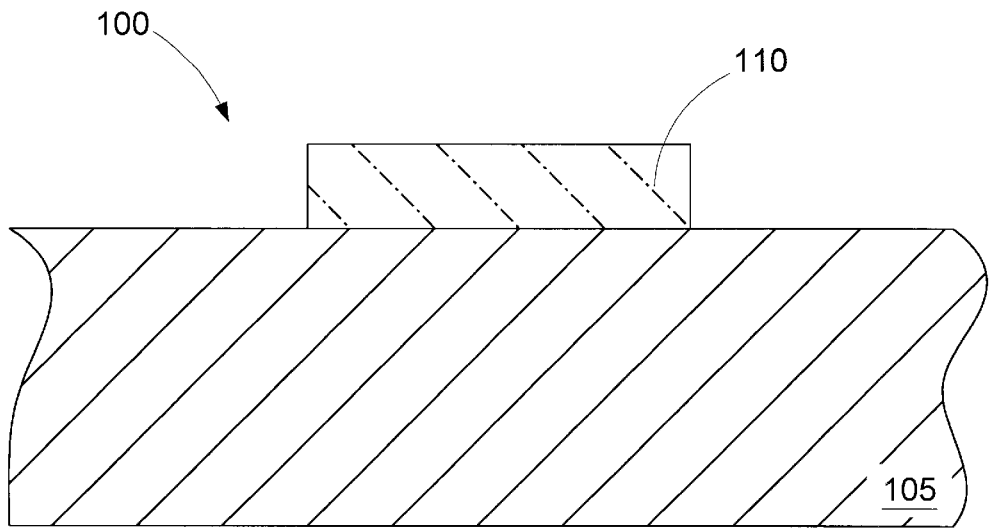
FIG. 2 is a cross-sectional view of an illustrative semiconductor substrate in accordance with the present invention after a masking layer has been deposited on the substrate.

Referring to FIG. 2, a process for forming an interconnect structure 100 useful for testing discrete semiconductor dice (not shown) is described. A substrate 105 formed of a semiconductive material, such as monocrystalline silicon, is provided. A masking layer 110 is formed on the substrate 105 and photopatterned. In the illustrated embodiment, the masking layer 110 is a silicon nitride layer having a thickness of about 500 to 3000 Å, however, it is contemplated that other masking layers known to those of ordinary skill in the art may be used.

Figure 3:
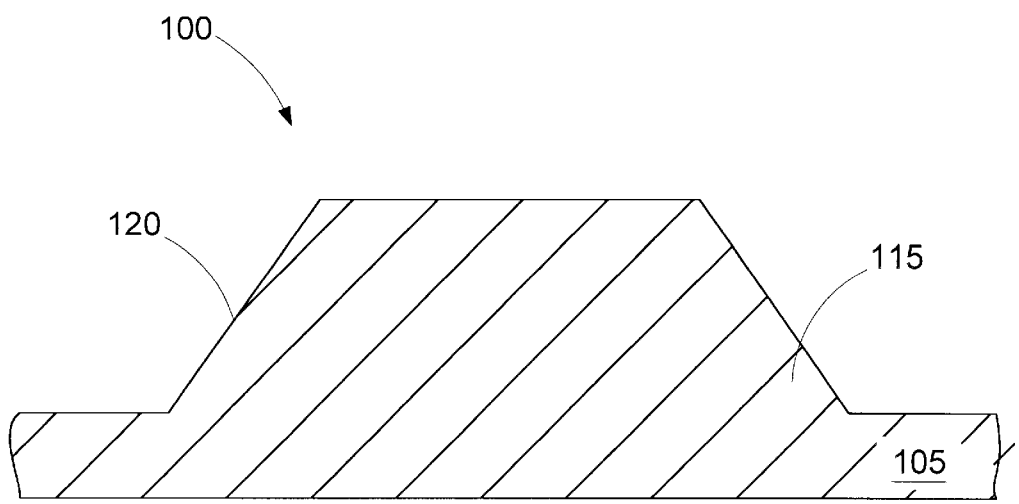
FIG. 3 is a cross-sectional view of the device of FIG. 2 after a raised contact member has been formed on the substrate.

As shown in FIG. 3, the substrate 105 is etched around the masking layer 110 to form a raised contact member 115. An illustrative etching technique for forming the raised contact member 115 includes wet anisotropic etching with a mixture of KOH:H$_2$O. This type of etching is known in the art as bulk micromachining. The raised contact member 115 is sized and shaped to interface with a ball (not shown) of a semiconductor die (not shown). The raised contact member 115, viewed from above, has a generally rectangular peripheral configuration with sides of about 25 microns in length. The etching process results in a sidewall 120 of the raised contact member 115 being at an angle of about 54° with respect to the surface of the substrate 105. The raised contact member 115 has a height of about 20% to 30% of the height of the ball (not shown). It is contemplated that the raised contact member 115 may be formed in other peripheral configurations such as triangles, polygons, or circles. The raised contact member 115 may also be formed in an essentially frustoconical shape.

Figure 4:
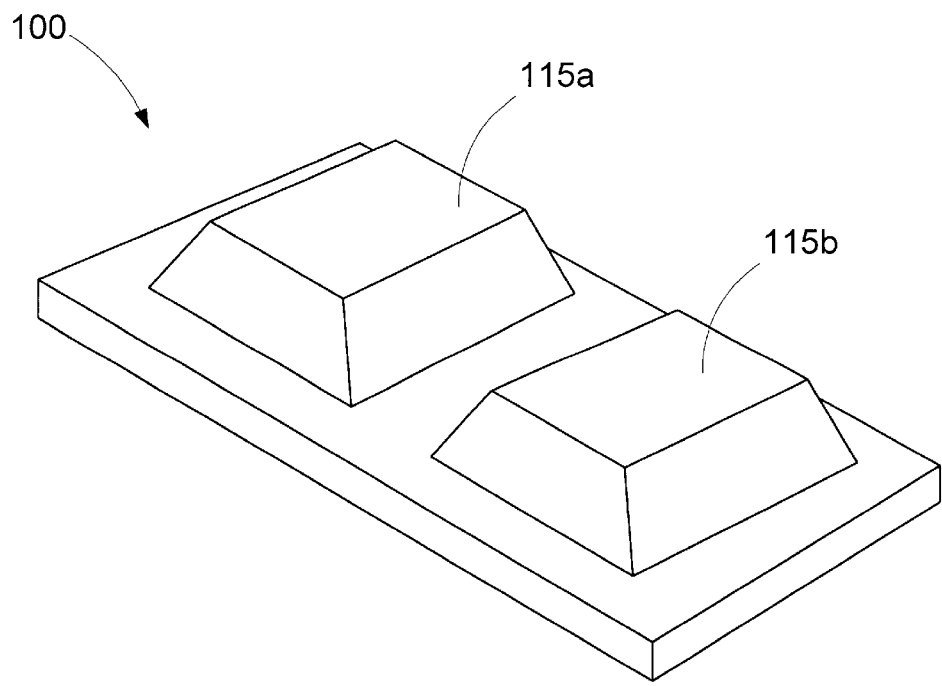
FIG. 4 is a partial isometric view of two adjacent raised contact members.

Turning now to FIG. 4, two adjacent raised contact members 115a and 115b are shown extending from the substrate 105. The spacing of the raised contact members 115a and 115b matches the spacing of adjacent balls (not shown) on a semiconductor die (not shown) (e.g., about 50 to 100 microns).

Figure 5:
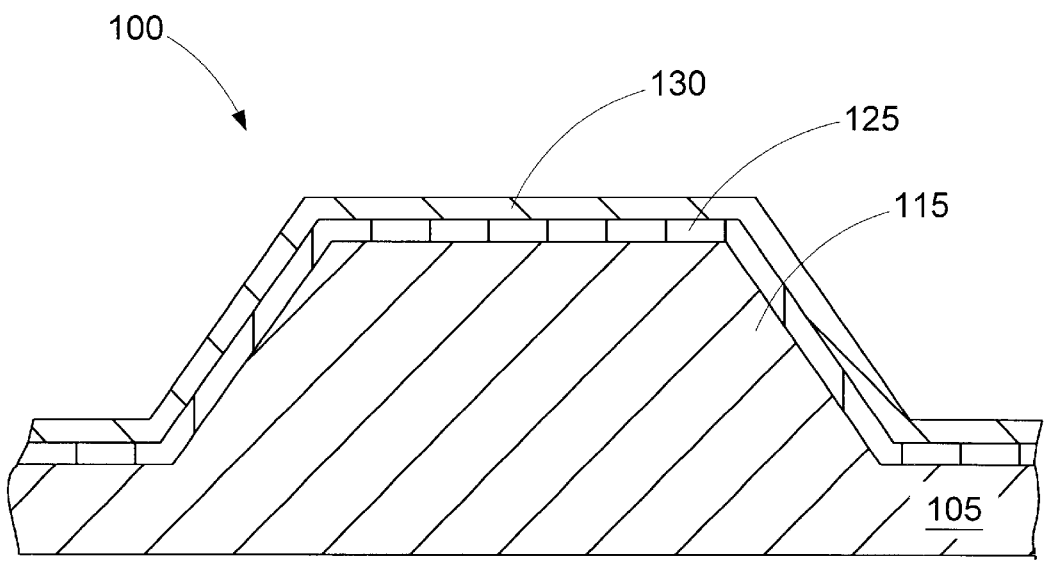
FIG. 5 is a cross-sectional view of the device of FIG. 3 after an insulating layer and a silicon containing layer have been formed thereon.

Referring to FIG. 5, an insulating layer 125 (e.g., SiO$_2$) is formed on the substrate 105 and raised contact members 115. The insulating layer 125 is formed by oxidation of the substrate 105 and may be accomplished by exposing the substrate 105 and to an oxidizing atmosphere for a short time. SiO$_2$ can also be deposited using chemical vapor deposition (CVD). Another commonly used insulator suitable for this purpose is Si$_3$N$_4$.

As also shown in FIG. 5, a silicon containing layer 130, such as a polysilicon layer, is formed on the insulating layer 125. The silicon containing layer 130 may be formed of doped or undoped polysilicon. Alternately, other silicon containing layers such as doped or undoped amorphous silicon may be employed. Polysilicon has a lower resistivity and better electrical and structural properties than other silicon containing layers, and also, polysilicon is suitable for simpler etching processes. The silicon containing layer 130 may be deposited on the insulating layer 125 using a suitable deposition process such as CVD or by using an epitaxial growth process. In the illustrated embodiment, the thickness of the silicon containing layer 130 is between about 500 Å and 3000 Å.

Figure 6:
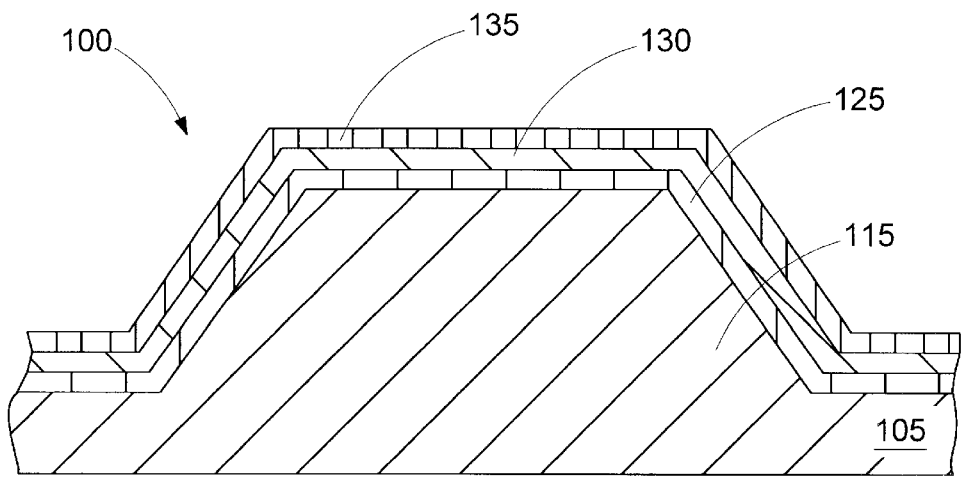
FIG. 6 is a cross-sectional view of the device of FIG. 5 after a second insulating layer has been formed thereon.

Turning now to FIG. 6, a second insulating layer 135 (e.g., SiO$_2$) is formed on the silicon containing layer 130. The second insulating layer 135 may be deposited using CVD techniques or formed by exposing the silicon containing layer 130 to an oxidizing environment. In the illustrated embodiment, the thickness of the second insulating layer 135 is between about 500 Å and 3000 Å.

Figure 7:
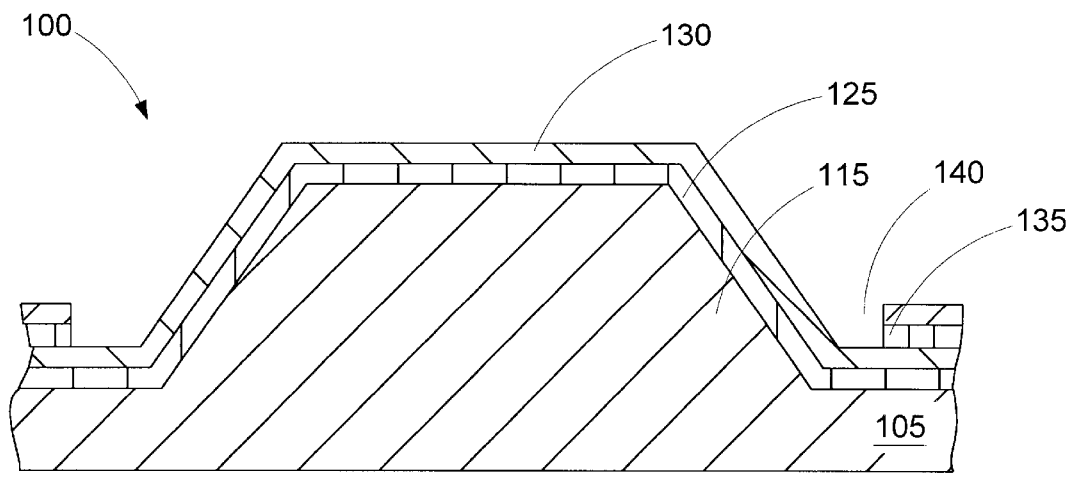
FIG. 7 is a cross-sectional view of the device of FIG. 6 after a layer of photoresist has been deposited and a portion of the second insulating layer has been removed.

Next, as shown in FIG. 7, a photoresist layer 140 is formed on the substrate 105 by spin-on or other suitable deposition process. The photoresist layer 140 is then developed such that the raised contact members 115 are exposed. Because the photoresist layer 140 tends to puddle on the lower portions of the interconnect structure 100, such as the surface of the substrate 105, the raised contact members 115 remain exposed. Following development of the photoresist layer 140, the unmasked portions of the second insulating layer 135 are removed, leaving the silicon containing layer 130 exposed on the tip of the raised contact member 115. This may be accomplished using a dry etch process with a chlorine or fluorine based etchant such as CF$_4$, CHF$_3$, C$_2$F$_6$, or C$_3$F$_8$.

Figure 8:
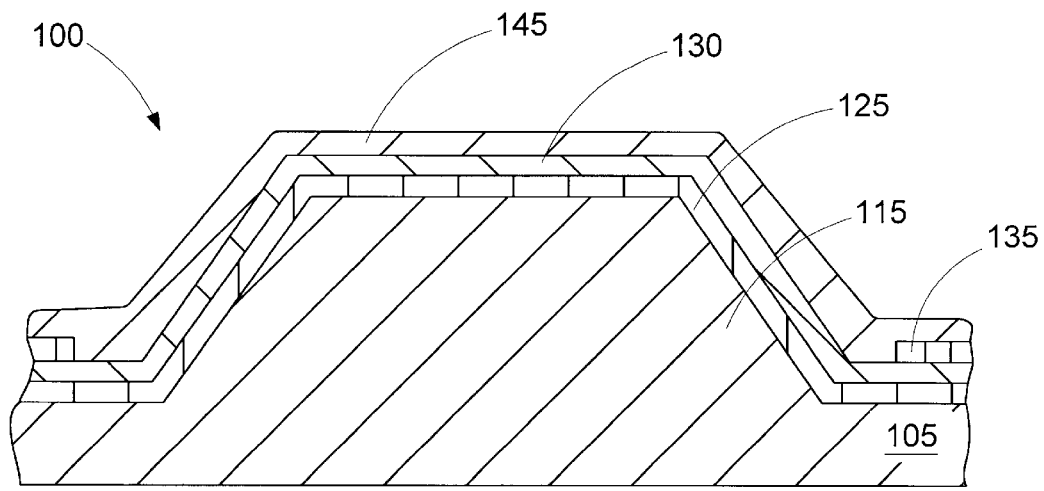
FIG. 8 is a cross-sectional view of the device of FIG. 7 after a metal layer has been formed thereon.

As shown in FIG. 8, the photoresist layer 140 is removed and a metal layer 145 is deposited on the exposed silicon containing layer 130. The metal layer 145 covers the silicon containing layer 130 on the tip and sidewalls of the raised contact member 115. In addition, the metal layer 145 covers the second insulating layer 135 on the substrate 105. The metal layer 145 may be deposited to a thickness of between about 500 Å and 3000 Å using a suitable deposition process such as low pressure chemical vapor deposition (LPCVD) or other standard metal sputtering or evaporation techniques.

The metal layer 145 is formed of a metal that will react with the silicon containing layer 130 to form a metal silicide. Suitable metals include the refractory metals, such as titanium (Ti), tungsten (W), tantalum (Ta), platinum (Pt) and molybdenum (Mo). In general, silicides of these metals ($WSi_2$, $TaSi_2$, $MoSi_2$, $PtSi_2$ and $TiSi_2$) are formed by alloying with a silicon containing surface. Other suitable metals include cobalt (Co), nickel (Ni), molybdenum (Mo), copper (Cu), gold (Au), iridium (Ir), and the like.

Following the deposition of the metal layer 145, a sintering process is performed in which the metal layer 145 is heated and reacts with the silicon containing layer 130 to form a silicide. This type of sintering process is known in the art as silicide sintering. Such a silicide sintering step may be performed by heating the silicon containing layer 130 and the metal layer 145 to a temperature of between about 650° and 820° C. (i.e., for layers having thicknesses in the range of about 2000 Å–3000 Å). This sintering process may be performed in one single step or using multiple temperature steps. A silicide layer 150 forms at the interface of the metal layer 145 and the silicon containing layer 130.

Figure 9:
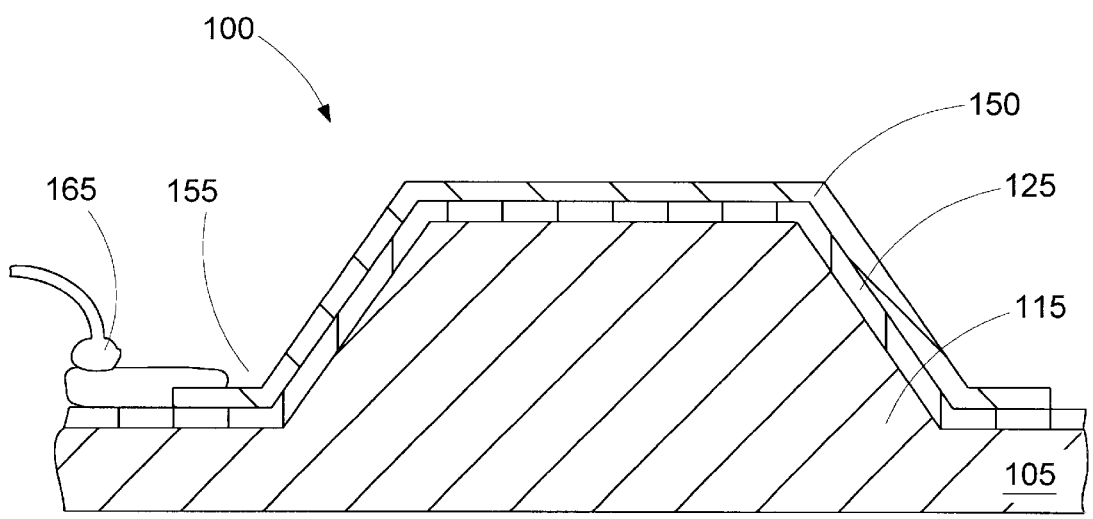
FIG. 9 is cross-sectional view of the device of FIG. 8 after a metal silicide, conductive traces, and wire bonds have been formed thereon.

Referring to FIG. 9, the unreacted portions of the metal layer 145 and the silicon containing layer 130 are removed while the silicide layer 150 remains over at least a portion of the raised contact member 115. This may be done by etching the metal layer 145 and the silicon containing layer 130 selective to the silicide layer 150. An exemplary etch process for a $TiSi_2$ silicide includes etching the unreacted portion of a titanium metal layer 145 with a wet etchant, such as a solution of ammonium hydroxide ($NH_4OH$) and hydrogen peroxide, or a $H_2SO_4$, $H_2O_2$ mixture, that will attack the metal layer 145 and not the silicide layer 150. Alternately, a dry etch process may be used to etch the metal layer 145 selective to the silicide layer 150.

For etching the unreacted portion of the silicon containing layer 130 selective to the silicide layer 150, a wet etchant such as an $HF:HNO_3:H_2O$ acid mixture (e.g., typical ratios of 1:10:10) may be used to remove the unreacted portion. A wet isotropic etchant, such as ammonium hydroxide ($NH_4OH$), may also be used for this purpose. Alternately the silicon containing layer 130 may etched selective to the silicide layer 150 using a dry etch process and an etchant such as $NF_3$ at low pressures or $Cl_2$ and HBr. The remaining second insulating layer 135 on the substrate 105 is etched away prior to the etch of the silicon containing layer 130 described above. This may be accomplished using a dry etch process as previously described.

As shown in FIG. 9, the completed interconnect 100 includes the silicide layer 150 covering part of the base of the raised contact member 115. Alternatively, the silicide layer 150 may be formed to cover only the tip and a portion of the sidewalls of the raised contact member 115. The resistivity of the silicide layer 150 may be lowered using an annealing process. This may be accomplished by heating the substrate 105 and silicide layer 150 to a temperature of between about 780° C. and 850° C. for several minutes.

Also shown in FIG. 9, a conductive trace 155 may be formed on the substrate 105 to provide a conductive path in electrical contact with the silicide layer 150. The conductive trace 155 is formed by depositing and etching a second metal layer comprising a highly conductive metal such as aluminum, copper or alloys thereof, or a refractory metal such as titanium, tungsten, tantalum and molybdenum or alloys of these metals. Other conductive materials such as polysilicon may also be employed to form the conductive trace 155. The conductive trace 155 may be formed using a standard metallization process such as a blanket CVD deposition or sputtering followed by photopatterning and etching. As an example, a wet etchant such as $H_3PO_4$ can be used to etch a patterned aluminum layer selectively from desired areas on the substrate 105 to form an aluminum conductive trace 155.

Figure 10A:
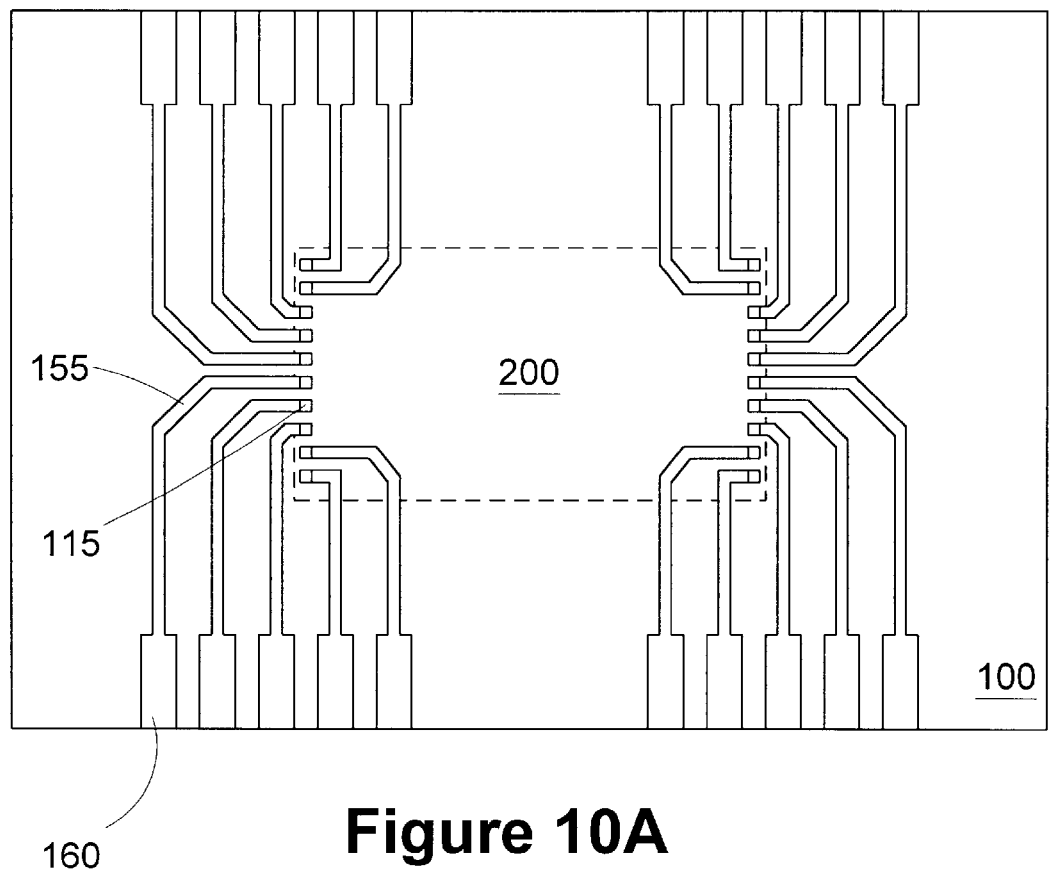
FIG. 10A is a top view of an interconnect structure in accordance with the present invention showing the relative arrangements of the raised contact members and conductive traces.
Figure 10B:
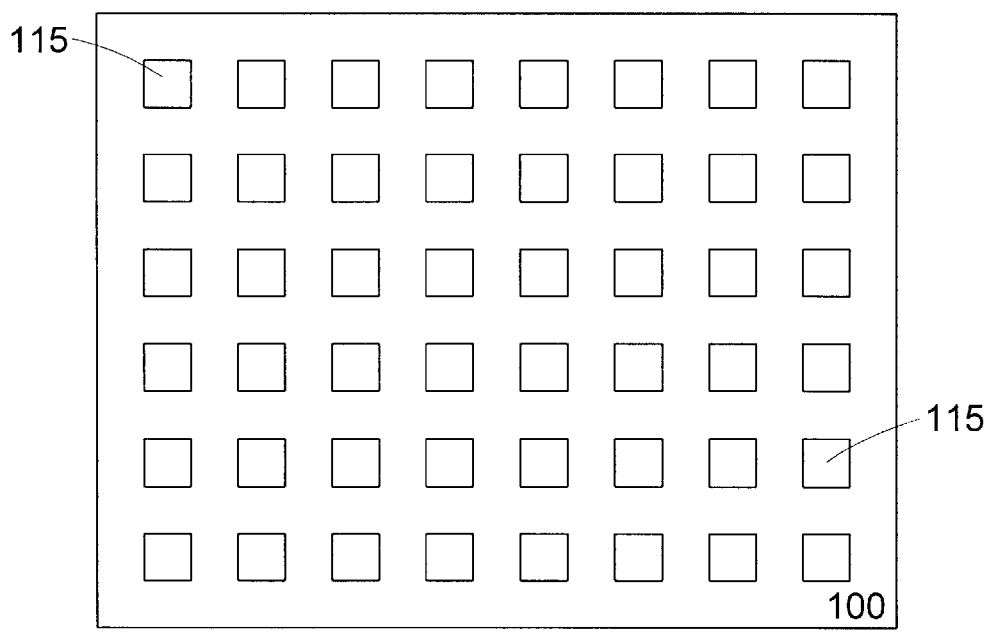
FIG. 10B is a top view of an alternative interconnect structure showing the raised contact members in a grid arrangement.

FIG. 10A illustrates an exemplary layout for the conductive traces 155 and raised contact members 115. The specific layout depends on the ball configuration of the die under test (not shown). Common layouts typically include array formats, as shown in the magnified view of FIG. 10B. For ease of illustration, the conductive traces 155 are not shown in FIG. 10B. A large number of interconnect structures 100 may be formed using semiconductor circuit fabrication techniques on a single substrate or wafer (not shown). The wafer (not shown) may then be sawed (i.e., diced) to singulate the interconnect structures 100.

Each conductive trace 155 includes a bonding site 160 for wire bonding with a bond wire 165 (shown on FIG. 9). In FIG. 9, the bond wire 165 is shown proximate the raised contact member 115. However, as seen in FIG. 10, the bonding site 160 is actually remote from the raised contact member 115. The bond wires 165 are wire bonded to the bonding sites 160 of the conductive traces 155 utilizing a conventional wire bonding process (e.g., solder ball) to provide a conductive path from the completed interconnect structure 100 to external test circuitry (not shown). In place of a wire bonding process, other conductive paths such as external connector pads (not shown), slide connectors (not shown), and other mechanical connector arrangements (not shown) may be utilized.

Figure 11:
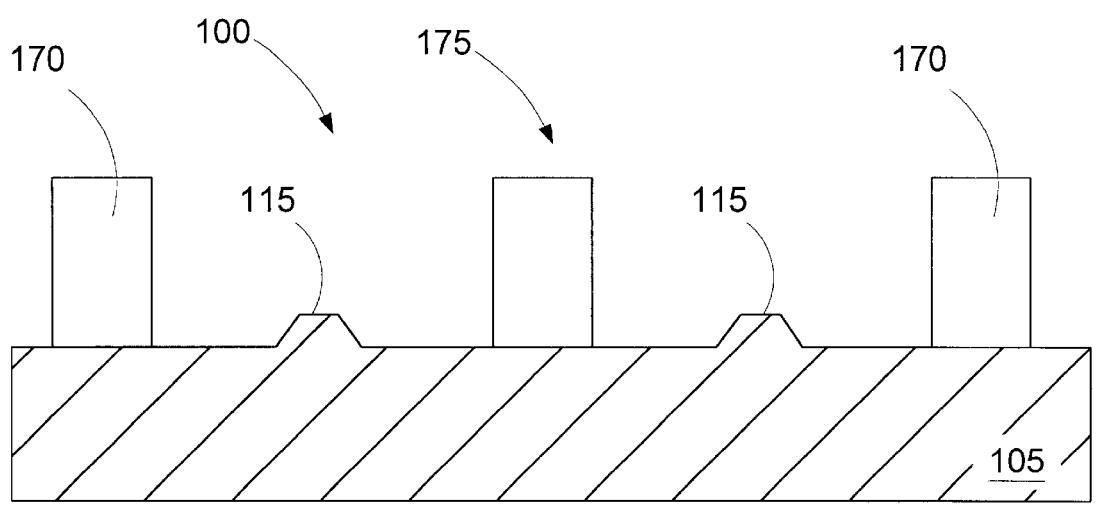
FIG. 11 is a cross-sectional view of the device of FIG. 9 with an alignment grid formed thereon.

Turning now to FIG. 11, a cross-sectional view of two adjacent raised contact members 115 is provided. For clarity and ease of illustration, not all previously described layers are shown. A photoresist layer 170 is deposited, such as by a spin-on or other suitable deposition process. The photoresist layer 170 is developed and removed to form an alignment grid 175 separating the adjacent raised contact members 115. The height of the alignment grid 175 is between about 30 and 100 microns. The alignment grid 175 may surround only a portion of the raised contact member 115, or it may surround the raised contact member 115 entirely.

In the illustrated embodiment, the photoresist layer 170 is an SU-8 photoresist. As is known to those of ordinary skill in the art, SU-8 photoresist is formed by dissolving EPON® Resin SU-8, sold by Shell Chemical Corporation, with an organic solvent (e.g., gamma butyloracton). The SU-8 photoresist may be developed using proplyenglycolmonomethlyether acetate (PGMEA) and stripped with a hot n-methylpyrrolidone (NMP) solvent.

Figure 12:
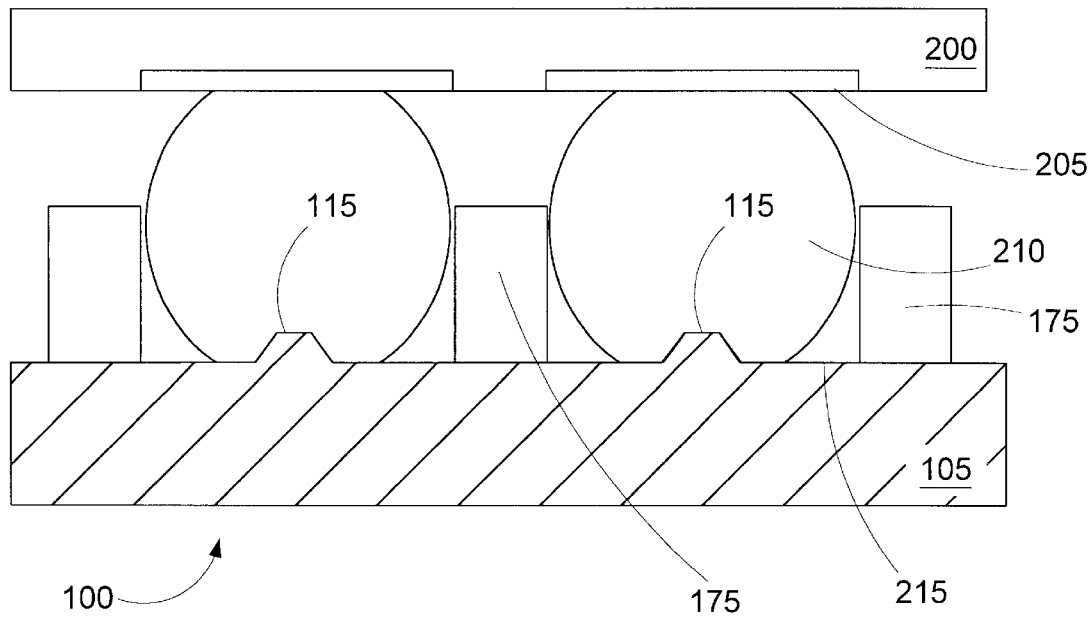
FIG. 12 is a cross-sectional view of the device of FIG. 11 interfacing with a semiconductor die under test.

Referring now to FIG. 12, a cross-section of the interconnect structure 100 is shown engaging a semiconductor die 200 as a die under test (DUT). The semiconductor die 200 is an unpackaged die having a bond pad 205 formed with a metal bump 210. The metal bump 210 has a diameter of between about 200 and 500 microns. For testing the semiconductor die 200, the interconnect structure 100 and semiconductor die 200 are mounted within a temporary carrier (not shown) suitable for testing discrete unpackaged semiconductor die. An exemplary temporary carrier is described in U.S. Pat. No. 5,302,891, entitled "Discrete Die Burn-In For Non-Packaged Die," which is incorporated herein by reference in its entirety. Other suitable carriers are disclosed in U.S. patent application Ser. No. 08/345,064 filed Nov. 14, 1994, and entitled "Carrier For Testing An Unpackaged Semiconductor Die," which is also incorporated herein by reference in its entirety. With such a carrier (not shown) the interconnect structure 100 is used to establish a temporary electrical connection with the semiconductor die 200. The interconnect structure 100 and the semiconductor die 200 are temporarily biased together by the carrier (not shown) and are separated following the test procedure.

Initially, the interconnect structure 100 is mounted within the carrier (not shown) and wire bonds 165 (shown in FIG. 9) are wire bonded to the bond sites 160 (shown in FIG. 10). Alternatively mechanical connectors (not shown) may be used. The wire bonds 165 are in electrical communication with external connections (not shown) on the carrier (not shown). The external connectors (not shown) on the carrier (not shown) are connectable to external test circuitry (not shown) adapted to generate test signals for testing the operability of the integrated circuits formed on the semiconductor die 200. The carrier (not shown) includes provisions for biasing the semiconductor die 200 and the interconnect structure 100 together. The alignment grid 175 aligns the metal bumps 210 with corresponding raised contact members 115, thus obviating the need for additional alignment provisions in the carrier (not shown).

The semiconductor die 200 and the interconnect structure 100 are biased together such that the raised contact members 115 penetrate into the metal bumps 210. The raised contact members 115 penetrate any oxide layer covering the metal bumps 210 to establish an ohmic connection. The penetration depth of the raised contact member 115 into the metal bump 210 is limited by a stop plane 215 provided by the flat top surface of the substrate 105. The raised contact member 115 are dimensioned to penetrate to a predetermined depth that is less than the diameter of the metal bump 210 (e.g., 200–500 microns).

In the illustrated embodiment, the raised contact members 115 have a height that is less than the diameter of the metal bump 210 to prevent excessive surface damage and spreading of the metal bump 210. The metal bumps 210 are typically used later for flip chip bonding of the semiconductor die 200 to a printed circuit board (not shown). If damage to the metal bump 210 is minimized during testing, the metal bump 210 will not require a subsequent reflow process.

Figure 13:
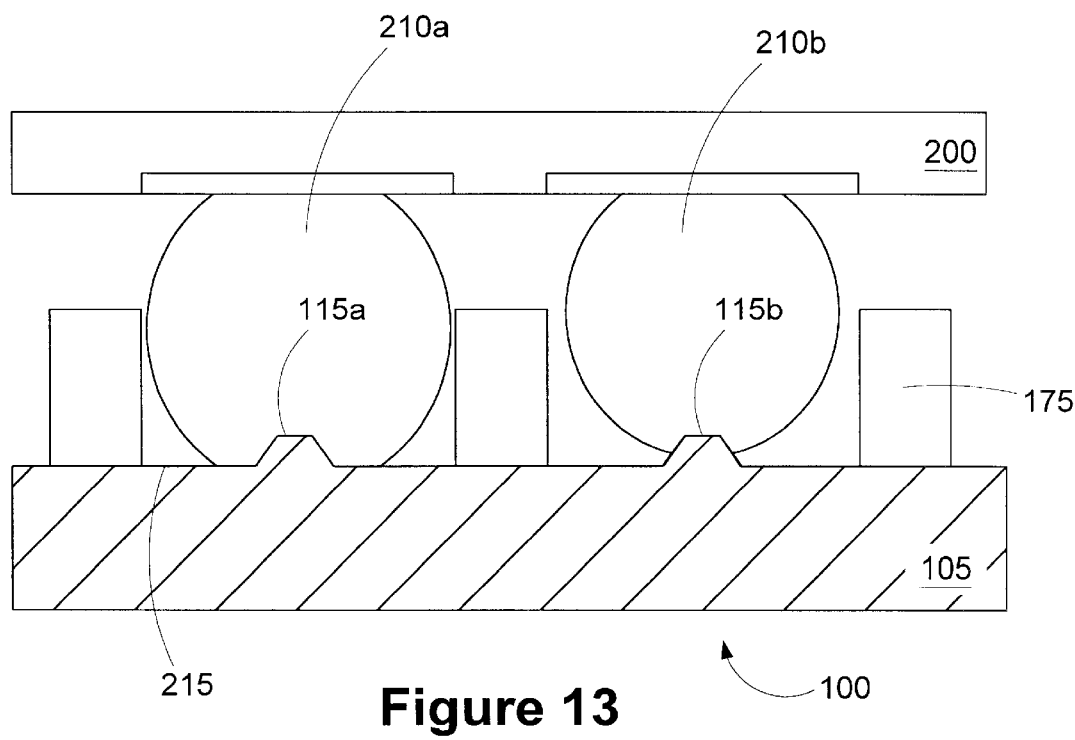
FIG. 13 is a cross-sectional view of the device of FIG. 11 interfacing with a semiconductor die under test having nonuniform metal bumps.

FIG. 13 illustrates the interconnect structure 100 engaging a semiconductor die 200 having non-uniform metal bumps 210a, 210b. The metal bump 210a is of sufficient size to fully 5 engage the raised contact member 115a. Insertion of the metal bump 210 is limited by the stop plane 215. The metal bump 210b is smaller than the metal bump 210a, and this, does not reach the stop plane 215. However, the raised contact member 115b is of sufficient height to engage the metal bump 210b and establish an electrical connection therebetween. Typically, the size of the metal bumps 210a, 210b formed on the semiconductor die 200 have a manufacturing tolerance. Knowing the tolerance of the metal bumps 210a, 210b allows the raised contact members 115a, 115b to be sized such that an electrical connection will be made even if the metal bump 115b does not fully reach the stop plane 215.

Figure 14:
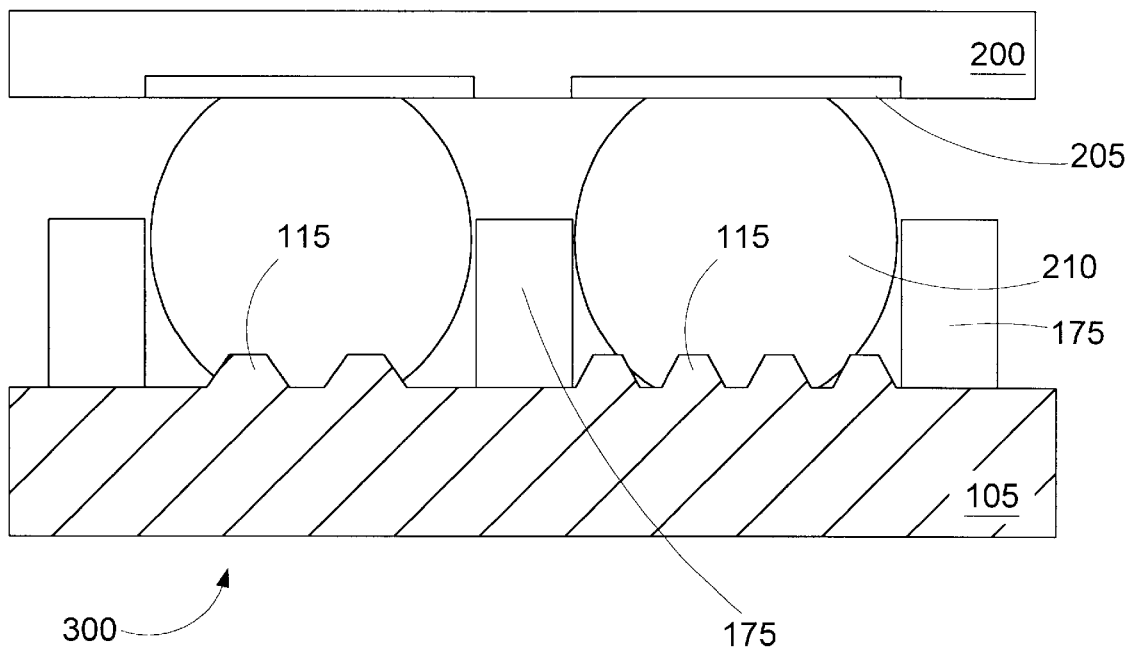
FIG. 14 is a cross-sectional view of an alternative interconnect structure in accordance with the present invention having multiple raised contact members per interface site.

FIG. 14 illustrates an alternative embodiment of an interconnect structure 300 engaging a semiconductor die 200. The interconnect structure 300 includes multiple raised contact members 115 disposed in each gap in the alignment grid 175 to provide additional contact area with the metal bumps 215 on the semiconductor die 200. The specific number of raised contact members 215 is application dependent.

Figure 15:
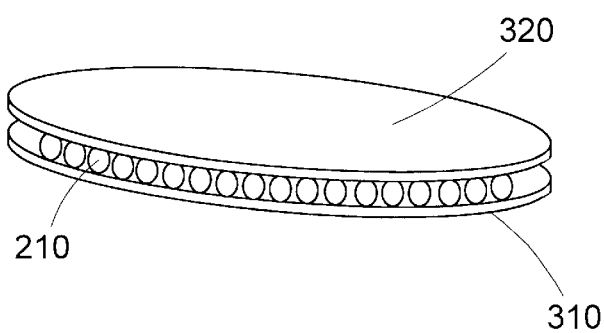
FIG. 15 is an isometric view of a wafer having the interconnect structures of FIG. 11 interfacing with a second wafer having metal bumps formed thereon.

Although the interconnect structures 100, 300 described herein are shown interfacing with a semiconductor die 200, it is also contemplated that the interconnect structures 100, 300 may be used at the wafer level. As shown in FIG. 15, the interconnect structures 100, 300 (not visible) may be formed on a first wafer 310 and the metal bumps 210 may be formed on a second wafer 320. The first and second wafers 310, 320 may be biased together to establish electrical contact therebetween. For purposes of illustration, the size of the bumps 210 is exaggerated. Also, the bumps 210 are shown near the periphery of the wafer 320, while in an actual implementation, the bumps 210 may actually be located entirely on the interior region of the wafer 320. This allows the all of the bumped die (e.g., 200) on the wafer 320 to be tested at once prior to singulating or sawing the die. Such testing may be implemented at the initial wafer probing level that checks for die functionality or at burn-in.

During wafer level burn-in the entire wafer 320, in addition to being electrically biased, is subjected to temperatures from 50° C. to 150° C. The temperature selected should take into account the composition of the bumps 210 so as not to exceed their melting temperature. For example, in the case of eutectic solder balls, which are 67% tin and 37% lead, the temperature is typically kept below about 140° C. A latching mechanism or other force applying mechanism (not shown) is used for applying a retaining force to keep the wafer 320 under test and the wafer 310 having the interconnect structures 100, 300 mechanically and electrically in contact. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An interconnect structure, comprising:
   a substrate;
   a raised contact member defined in the substrate;
   a conductive layer covering at least a portion of the raised contact member;
   a conductive trace in electrical communication with the conductive layer; and
   an alignment grid proximate the raised contact member and being adapted to interface with a raised bonding site of a device to align the raised bonding site with respect to the raised contact member.

2. The interconnect structure of claim 1, wherein the alignment grid at least partially surrounds the raised contact member.

3. The interconnect structure of claim 1, wherein the alignment grid surrounds the raised contact member.

4. The interconnect structure of claim 1, wherein the alignment grid comprises a photoresist material.

5. The interconnect structure of claim 1, wherein the photoresist material comprises an SU-8 photoresist material.

6. The interconnect structure of claim 1, further comprising an insulating layer disposed between the raised contact member and the conductive layer.

7. The interconnect structure of claim 1, further comprising a plurality of raised contact members, wherein the alignment grid at least partially surrounds at least two adjacent raised contact members.

8. The interconnect structure of claim 1, further comprising a plurality of raised contact members arranged in a grid format.

9. A testing system, comprising:
 a device having raised bonding sites; and
 an interconnect structure coupled to the raised bonding sites, including:
  a substrate;
  a raised contact member;
  a conductive layer covering at least a portion of the raised contact member, the conductive layer electrically communicating with one of the raised bonding sites;
  a conductive trace in electrical communication with the conductive layer; and
  an alignment grid proximate the raised contact member, the alignment grid interfacing with the raised bonding site to align the raised bonding site with respect to the raised contact member.

10. The testing system of claim 9, further comprising logic adapted to provide a signal to the device through the conductive trace.

11. The testing system of claim 9, wherein the alignment grid at least partially surrounds the raised contact member.

12. The testing system of claim 9, wherein the alignment grid surrounds the raised contact member.

13. The testing system of claim 9, wherein the alignment grid comprises a photoresist material.

14. The testing system of claim 9, wherein the photoresist material comprises an SU-8 photoresist material.

15. The testing system of claim 9, wherein the raised contact member extends at least partially into the raised bonding site.

16. The testing system of claim 9, wherein the interconnect structure includes a plurality of raised contact members, and the alignment grid at least partially surrounds at least two adjacent raised contact members.

17. The testing system of claim 9, wherein the interconnect structure includes a plurality of raised contact members arranged in a grid format.

* * * * *